United States Patent
Dewdney (10) Patent No.: US 10,408,902 B2
(45) Date of Patent: Sep. 10, 2019

(54) METHOD FOR IMPROVING SHIM PRE-SETTINGS OF A MAGNETIC RESONANCE DEVICE

(71) Applicant: Andrew Dewdney, Neunkirchen am Brand (GB)

(72) Inventor: Andrew Dewdney, Neunkirchen am Brand (GB)

(73) Assignee: Siemens Aktiengesellschaft, München (DE)

(*) Notice: Subject to any disclaimer, the term of this patent is extended or adjusted under 35 U.S.C. 154(b) by 687 days.

(21) Appl. No.: 14/795,484

(22) Filed: Jul. 9, 2015

(65) Prior Publication Data
US 2016/0011287 A1    Jan. 14, 2016

(30) Foreign Application Priority Data

Jul. 10, 2014  (DE) .................. 10 2014 213 443

(51) Int. Cl.
*G01R 33/3875*    (2006.01)

(52) U.S. Cl.
CPC ................ *G01R 33/3875* (2013.01)

(58) Field of Classification Search
CPC ............ G01R 33/3875; G01R 33/5608; G01R 33/5611; G01R 33/4835; G01R 33/4828; G01R 33/543
USPC ........................................................ 324/309
See application file for complete search history.

(56) References Cited

U.S. PATENT DOCUMENTS

| | | | | |
|---|---|---|---|---|
| 6,064,208 A * | 5/2000 | Steckner | ............ | G01R 33/3875 324/300 |
| 7,535,231 B2 | 5/2009 | Dewdney et al. | | |
| 2006/0164082 A1* | 7/2006 | Foxall | ................ | G01R 33/3875 324/306 |
| 2008/0088306 A1 | 4/2008 | Dewdney et al. | | |
| 2011/0163749 A1* | 7/2011 | Katscher | ............ | G01R 33/3415 324/307 |

(Continued)

FOREIGN PATENT DOCUMENTS

DE    102012206300 B3    7/2013

OTHER PUBLICATIONS

Clare S. et al. "Requirements for Room Temperature Shimming of the Human Brain," Magnetic Resonance in Medicine 55, pp. 210-214, 2006.

(Continued)

*Primary Examiner* — Christopher P McAndrew
(74) *Attorney, Agent, or Firm* — Lempia Summerfield Katz LLC (57) ABSTRACT

A method for improving shim pre-settings of a magnetic resonance device and a magnetic resonance device are provided. Efficient computation of shim settings for magnetic resonance imaging is provided by the method. The method includes loading of shim pre-settings from a database, creating shim settings using the shim pre-settings for recording magnetic resonance image data of an examination object by a magnetic resonance device, and activating a shim unit of the magnetic resonance device for recording the magnetic resonance image data. The method also includes using the created shim settings, improving the shim pre-settings using the created shim settings, and storing the improved shim pre-settings in the database.

20 Claims, 2 Drawing Sheets

(56) References Cited

U.S. PATENT DOCUMENTS

2012/0092014 A1\* 4/2012 Castillo .............. G01R 33/3875
                                                    324/318
2012/0098541 A1\* 4/2012 Konijn ............... G01R 33/3875
                                                    324/322
2012/0161766 A1\* 6/2012 Harvey .............. G01R 33/5612
                                                    324/309
2013/0274594 A1    10/2013 Biber
2014/0184226 A1\* 7/2014 Seeber ............... G01R 33/3875
                                                    324/322

OTHER PUBLICATIONS

German Office Action for related German Application No. 10 2014 213 443.9, dated Apr. 15, 2015, with English Translation.

\* cited by examiner

METHOD FOR IMPROVING SHIM PRE-SETTINGS OF A MAGNETIC RESONANCE DEVICE

CROSS-REFERENCE TO RELATED APPLICATIONS

The present patent document claims the benefit of DE102014213443.9, filed on Jul. 10, 2014, which is hereby incorporated by reference.

TECHNICAL FIELD

The present embodiments relate to a method for improving shim pre-settings of a magnetic resonance device.

BACKGROUND

In a magnetic resonance device, such as a magnetic resonance tomography system, the body of a person to be examined (e.g., a patient) may be subjected to a relatively high magnetic field (e.g., 1.5, 3 or 7 Tesla) with the aid of a main magnet. Additionally, gradient pulses are applied with the aid of a gradient coil unit. Using a radio-frequency antenna unit, high-frequency radio frequency pulses, such as excitation pulses, are then sent out using suitable antenna devices. The high-frequency radio frequency pulses lead to the nuclear spin of specific atoms excited resonantly by the radio frequency pulses being flipped by a defined flip angle in relation to the magnetic field lines of the main magnetic field. During the relaxation of the nuclear spin, radio-frequency signals (e.g., magnetic resonance signals) are emitted. The radio-frequency signals are received by suitable radio frequency antennas and processed. The desired image data may be reconstructed from the raw data acquired.

For a specific measurement, a specific magnetic resonance sequence (e.g., a pulse sequence) including a sequence of radio-frequency pulses (e.g., excitation pulses and refocusing pulses) and gradient pulses is to be sent out. The radio-frequency pulses and gradient pulses are coordinated appropriately to be sent out in different gradient axes along different spatial directions. Read-out windows offset to match the pulses, which prespecify the periods of time in which the induced magnetic resonance signals will be detected, are set.

In magnetic resonance imaging using a magnetic resonance device, the homogeneity of a main magnetic field in an examination volume is of great importance. Even small deviations of the homogeneity may result in large deviations in a frequency distribution of the nuclear spin, so that lower-quality magnetic resonance image data is recorded.

In order to improve the homogeneity in the examination volume, shim units are used. When a magnetic resonance device is installed at its intended location, magnetic fields present in the environment may restrict the homogeneity of the main magnetic field, especially around an isocenter of the magnetic resonance device. Therefore, on installation and commissioning of a magnetic resonance device, frequently in conjunction with measurements, the shim unit is set so that homogeneity is optimized. Basic shim settings are computed during installation and commissioning of the magnetic resonance device.

A further source of inhomogeneity is represented, however, by the object to be examined. For example, if a person to be examined is introduced into the magnetic resonance device, the material of the body disrupts the homogeneity of the magnetic field. To counteract this problem, adjustable shim units are used. For example, electric shim coils that create different compensation magnetic fields when activated with different shim currents in order to improve the homogeneity are known.

In order to shim these disruptions of the object to be examined, upon activation of the shim unit, basic shim settings obtained during the installation and commissioning of the magnetic resonance device are used to take a measurement of the field distribution when the person to be examined is introduced into a patient accommodation area of the magnetic resonance device. Thereafter, starting from the basic shim settings, shim settings are established using the control unit, taking into account the measured field distribution. The shim unit is then activated using the shim settings in order to obtain an optimum possible homogeneity.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an efficient computation of shim settings for a magnetic resonance imaging device is provided.

A method for improving shim pre-settings for a magnetic resonance device includes loading shim pre-settings from a database, and creating shim settings using the shim pre-settings for recording of magnetic resonance image data of an examination object using the magnetic resonance device. The method also includes activating a shim unit of the magnetic resonance device for the recording of magnetic resonance image data using the created shim settings, improving the shim pre-settings using the created shim settings, and storing the improved shim pre-settings in the database.

The examination object may be a patient, a training person or a phantom. Based on magnetic resonance image data, for example, magnetic resonance images are created by a computing unit of the magnetic resonance device. The magnetic resonance images may be output on a display unit of the magnetic resonance device and/or may be stored in a database.

Shim pre-settings, for example, represent a starting point for calculating the shim settings. The shim pre-settings are used for creating shim settings for an actual recording of magnetic resonance image data. In such cases, a shim measurement (e.g., an adjustment measurement) is performed to create shim settings, with the shim pre-settings used as starting values for the shim measurement. By choosing shim pre-settings, the shim measurement may then converge more quickly. The shim pre-settings may be starting values for an algorithm that generates shim settings from the shim pre-settings for an actual application. A database in which the shim pre-settings are stored may be assigned to a specific magnetic resonance device.

Shim settings may include settings for activating a shim unit of the magnetic resonance device. For example, the shim settings may define a possibly time-dependent current distribution of the currents in shim coils of the shim. A shim control unit may apply the currents defined by the shim settings to the shim coils during the recording of the magnetic resonance image data. Based on the shim settings, a frequency adjustment may also be carried out before acquiring magnetic resonance image data. The different shim settings may be created before acquiring the magnetic resonance image data.

Improving on the shim pre-settings using the created shim settings may result in improved shim pre-settings in relation to the initial shim pre-settings. The improved shim pre-settings may then replace the shim pre-settings. The improved shim pre-settings may represent an improved starting point for the creation of the shim settings. For example, the algorithm for creating the shim settings may converge quicker with the improved shim pre-settings as a starting value. Thus, the shim process for creating the shim settings may be accelerated and simplified (e.g., measuring time may be saved). Additionally, based on the improved shim pre-settings, suitable shim settings may be created, which lead, for example, to a high homogeneity of the main magnetic field for a specific application. Further, the improved shim pre-settings may be used directly for recording magnetic resonance image data that is less sensitive to specific shim settings. Thus, creating the shim settings may be omitted in specific cases if the improved shim pre-settings are already suitable for setting the shim unit.

In an embodiment, a method is executed iteratively, where the improved shim pre-settings stored in a database in one iteration are loaded from the database in the following iteration as shim pre-settings. For example, each method act, from loading of the shim pre-settings from the database to the storing the improved shim pre-settings, is executed iteratively. The shim pre-settings improved in an iteration may be used as a starting point for the creation of the shim settings in the following iteration. The present embodiment may result in an iterative improvement of the shim pre-settings that is implemented in a self-learning method. For example, magnetic resonance image data may be recorded in the different iterations by the same magnetic resonance device. With each magnetic resonance image data recording, the specific shim pre-settings for a magnetic resonance device may be improved. Thus, a calibration phase, occurring before a first recording of magnetic resonance image data using the magnetic resonance device to create the shim pre-settings, may be omitted because the shim pre-settings may be gradually be improved during the ongoing operation of the magnetic resonance device.

In an embodiment, the magnetic resonance image data is recorded in a first iteration from a first examination object and in a second iteration from a second examination object. The second examination object is different from the first examination object. In this embodiment, the shim pre-settings are able to be improved over a number of different examination objects. Thus, information about suitable shim settings from different examination objects may be included in the improved shim pre-settings. The improved shim pre-settings are suitable starting points for creating shim settings to examine further examination objects that differ from the first examination object and the second examination object. The shim pre-settings may also be tuned in this way individually to a patient collective that is examined by the magnetic resonance device. For example, the patient collective may be dependent on a region of the world in which the magnetic resonance device is installed. Thus, different patient collectives of different cultural circles typically have different body proportions, body-mass indexes, etc. Tuning the shim pre-settings to the patient collective specific to the magnetic resonance device may enable the shim pre-settings to be created iteratively.

In an embodiment, the shim unit of the magnetic resonance device includes a number of shim channels, with the shim settings including a number of shim currents. Each shim channel is assigned at least one shim current of the number of shim currents. For example, the shim unit may include three shim channels (e.g., one for each of the three spatial directions). The shim unit may also include additional shim channels that allow a finer setting of the shim fields. Further, the shim unit of the magnetic resonance device may include one or two shim channels. In this example, the shim settings include a first shim current value that will be set for the first shim channel, a second shim current value that will be set for a second shim channel, etc. The shim currents applied to the shim channels for recording the magnetic resonance image data form the shim settings. The shim currents may be kept constant during the entire recording of the magnetic resonance image data. Alternately, the shim settings may be variable shim currents adapted dynamically (e.g., during the recording of the magnetic resonance image data to changing boundary conditions).

In an embodiment, the shim pre-settings include a number of output shim currents, with each shim current assigned to at least one output shim current. The number of shim currents are created using the assigned output shim currents. The number of output shim currents held in the shim pre-settings is equal to the number of shim currents of the shim settings. Thus, upon creating the shim settings from the shim pre-settings, a shim current of the shim settings may be created in each case from an output shim current of the pre-settings. The output shim currents may be improved using the created shim currents. In this example, the output shim currents are improved individually using the shim current belonging to the individual output shim current. Further, a fixed current value may be added to the output shim currents before creating the shim settings. This fixed current value, referred to as a tune-up value, may be determined based on the calibration measurement (e.g., using a standardized phantom).

In an embodiment, the output shim currents are weighted with a weighting factor to be included in the creation of the shim currents. The weighting factor represents a measure of a number of iterations already performed. In this example, the output shim currents are weighted more heavily in creating the shim currents when more iterations have already taken place. This method takes into account the fact that the output shim currents are typically improved after each iteration. For example, if the shim pre-settings have already been improved frequently using the created shim settings, then the quality of the shim pre-settings is typically high. It may be avoided, by weighting the shim pre-settings, that in an early phase of the improvement, the shim pre-settings are weighted less heavily in creating the shim settings. For example, in this early learning phase, fluctuations in the calculation of the shim settings may be avoided. For example, in an implementation, the weighting factor may be proportional to the number of iterations already undertaken.

In an embodiment, the shim pre-settings are improved to include a calculation of improved output shim currents, where the output shim currents and the generated shim currents are averaged and included in the calculation of the improved output shim currents. This is an option for improving the shim pre-settings. Averaging the output shim currents and the generated shim currents may be performed across a number of iterations in a running averaging.

In an embodiment, the magnetic resonance image data is recorded from one examination area of the examination object with shim pre-settings specific to the examination area. For example, an examination area of the examination object may be a specific area of the body of the examination object, such as a head area, a thorax area, an abdomen area, etc. Thus, different shim pre-settings may be stored in the database for different examination areas. The different shim pre-settings may be improved independently of one another. For example, the shim pre-settings may be tuned specifically to particular examination areas. The shim pre-settings may be suited to creating shim settings for recording magnetic resonance image data from the specific examination area.

In an embodiment, the magnetic resonance image data is recorded using activated coil elements of at least one local coil, where the shim pre-settings are specific for the configuration of the activated coil elements. Typically, different configurations of activated coil elements of local coils need different shim settings for homogenization of the main magnetic field. For example, when the coil elements of a head coil are activated to record magnetic resonance image data, different shim settings may be needed than when, for example, the coil elements of a flexible head coil are activated. Thus, different shim pre-settings may be stored in a database for the different configurations of activated coil elements of the at least one local coil. The different shim pre-settings may be improved independently of one another. Thus, the shim pre-settings may be specifically tuned to particular configurations of activated coil elements of the at least one local coil.

In an embodiment, a magnetic resonance device including a shim unit, a computing unit and a shim control unit is provided. The magnetic resonance device carries out one or more of the methods described herein.

In an embodiment, the magnetic resonance device is configured to perform a method for the improvement of shim pre-settings of the magnetic resonance device. The computing unit is configured for loading shim pre-settings from a database. The computing unit is also configured, with the shim control unit, for creating shim settings while adapting the shim pre-settings for a recording of magnetic resonance image data of an examination object using the magnetic resonance device. The shim control unit is configured to activate a shim unit of the magnetic resonance device for the recording of the magnetic resonance image data using the created shim settings. The computing unit is configured to improve the shim pre-settings using the created shim settings and for storing the improved shim pre-settings in the database.

In an embodiment, the magnetic resonance device may include additional control components for performing one or more of the methods described herein. For example, computer programs and/or software may be stored in a memory unit of the computing unit and/or the control unit, and using a processor of the computing unit and/or the control unit, automatically controls and/or executes an execution sequence of a method.

In an embodiment, the computer program product is loaded directly into a memory of a programmable computing unit of a magnetic resonance device and has program code configured to perform a method when the computer program product is executed in the computing unit of the magnetic resonance device. The method is performed quickly in repeatable way and robustly. The computer program product is configured to execute the method acts using the computing unit. The computing unit may have prerequisites, such as an appropriate main memory, an appropriate graphics card, or an appropriate logic unit such that the respective method acts may be carried out efficiently. For example, the computer program product is stored on a computer-readable medium (e.g., a non-transitory computer-readable storage medium) or is stored on a network or server and may be loaded into the processor of a local computing unit directly connected to the magnetic resonance device or as a part of the magnetic resonance device. Control information of the computer program product may be stored on an electronically-readable data carrier. In this example, the control information of the electronically-readable data carrier may be configured such that, when the data carrier is used in the computing unit of a magnetic resonance device, the control information is executed to perform a method. Examples of electronically-readable data carriers include a DVD, a magnetic tape or a USB stick for storing electronically-readable control information, such as software. The control information (e.g., software) may be read from the data carrier and is stored in a controller and/or computing unit of a magnetic resonance device to perform the methods described above.

The advantages of various embodiments of the magnetic resonance device and/or the computer program product correspond to the advantages of various embodiments of the method described above. Likewise, various features, advantages or alternate forms of embodiments mentioned here correspond to other embodiments and vice versa.

DETAILED DESCRIPTION

Figure 1:
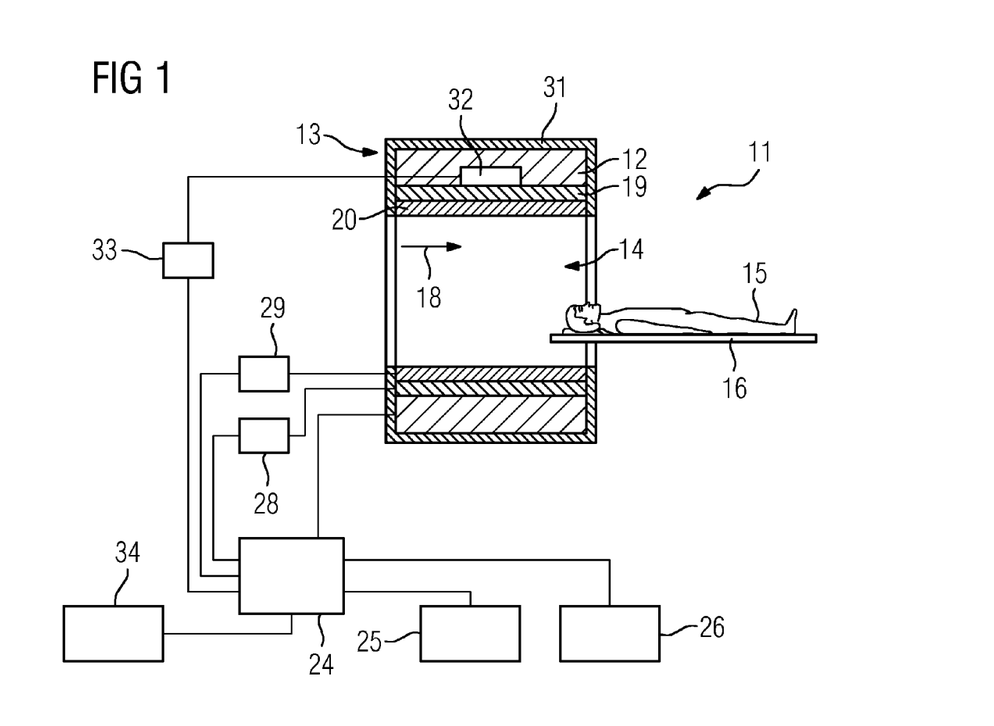
FIG. 1 depicts an embodiment of a magnetic resonance device in a schematic diagram.

FIG. 1 depicts one embodiment of a magnetic resonance device 11 schematically. The magnetic resonance device 11 includes a detector unit including a magnet unit 13 with a main magnet 17 configured to create a strong and, for example, constant main magnetic field 18. In addition, the magnetic resonance device 11 includes a cylindrical patient receiving area 14 for accommodating an examination object, such as a patient 15. The patient receiving area 14 is, for example, enclosed in a circumferential direction by the magnet unit 13 in a cylindrical shape. The patient 15 may be pushed into the patient receiving area 14 by a patient support facility 16 of the magnetic resonance device 11. The patient support facility 16 includes a horizontal table that is disposed movably within the magnetic resonance device 11. The magnet unit 13 is screened from the outside by a housing cover 31 of the magnetic resonance device.

The magnet unit 13 also includes a gradient coil unit 19 for creation of magnetic field gradients that are used for local encoding during imaging. The gradient coil unit 19 is activated by the gradient control unit 28. The magnet unit 13 also includes a radio-frequency antenna 20 depicted as a body coil permanently integrated into the magnetic resonance device 10, and a radio-frequency antenna control unit 29 for exciting a polarization that occurs in the main magnetic field 18 created by the main magnet 17. The radio-frequency antenna unit 20 is activated by the radio-frequency antenna control unit 29 and irradiates radio-frequency magnetic resonance sequences into an examination area that is essentially formed by the patient accommodation area 14. The radio-frequency antenna unit 20 is configured for receiving magnetic resonance signals, such as from the patient 15.

To control the main magnet 17, the gradient control unit 28, and the radio-frequency antenna control unit 29, the magnetic resonance device 11 includes a computing unit 24. The computing unit 24 centrally controls the magnetic resonance device 11, such as, for example, for executing a prespecified imaging gradient Echo sequence. The control information, such as imaging parameters and reconstructed magnetic resonance images, for example, may be displayed on a display unit 25 (e.g., on at least one monitor) of the magnetic resonance device 11 for a user. In addition, the magnetic resonance device 11 includes an input unit 26, by which information and/or parameters may be entered by a user during a measurement process. The computing unit 24 may include the gradient control unit 28 and/or radio-frequency antenna control unit 29 and/or the display unit 25 and/or the input unit 26.

The magnetic resonance device 11 further includes a shim unit 32 and a shim control unit 33 for controlling the shim unit 32. The shim control unit 33 is connected for exchanging data with the computing unit 24. The shim control unit 33 may also be part of the computing unit 24. The current that flows through the shim coils of the shim unit 32 may be adjusted by the shim control unit 33 based on the shim settings. The magnetic resonance device 11, with the calculation unit 24, the shim unit 32 and the shim control unit 33, is configured for carrying out one or more methods of the present embodiments. Further, the magnetic resonance device 11 includes a database 34 that is connected to the computing unit 24 in respect of an exchange of data. Shim pre-settings are stored in the database.

The magnetic resonance device 11 may include additional components known to a person skilled in the art.

Figure 2:
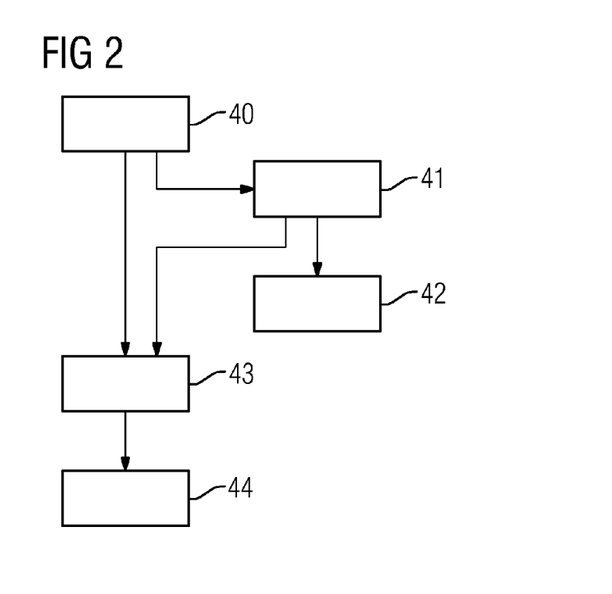
FIG. 2 depicts a flow diagram of an embodiment of a method.

FIG. 2 depicts a flow diagram of an embodiment of a method for improving shim pre-settings of a magnetic resonance device.

Figure 3:
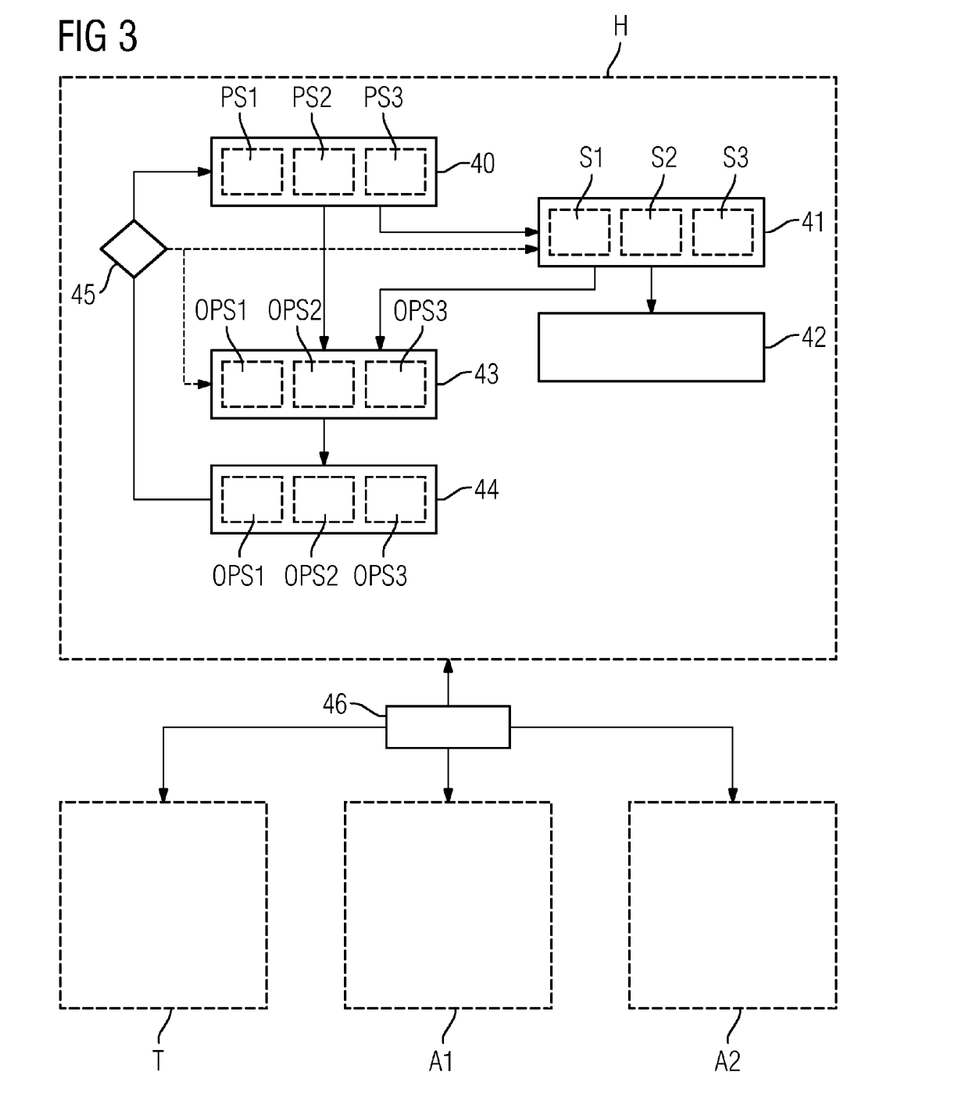
FIG. 3 depicts a flow diagram of another embodiment of a method.

In act 40, shim pre-settings are loaded from the database 34 by the computing unit 24 of the magnetic resonance device 11. Shim pre-settings may be stored in the database 34 beforehand for this purpose. For example, the shim pre-settings may, as depicted in FIG. 3, be specific for examination areas of the examination object 15 and/or specific for selected configurations of activated coil elements.

In act 41, shim settings are created by the computing unit, such as in conjunction with the shim control unit 33, by adapting the shim pre-settings for a recording of magnetic resonance image data of an examination object using a magnetic resonance device 11. In this example, the shim pre-settings may represent a point of departure for the creation of the shim settings. For example, using shim pre-settings may result in the shim settings converging more quickly than if the shim settings are calculated without the pre-settings.

In act 42, the shim control unit 33, using the created shim settings, controls the shim unit 32 for the recording of the magnetic resonance image data. For example, the created shim settings may specify that current flows through shim coils of the shim unit 32 during the recording of the magnetic resonance image data.

In act 43, the shim pre-settings are improved by the computing unit 24 by using the created shim settings. The original shim pre-settings may be replaced by the improved shim pre-settings, so that shim settings may be created for a subsequent measurement using the magnetic resonance device 11 using the improved shim pre-settings.

In act 44, the improved shim pre-settings are stored in the database 34.

FIG. 3 depicts a flow diagram of another embodiment of a method for improving shim pre-settings of a magnetic resonance device.

The description given below highlights the differences from the exemplary embodiment in FIG. 2. For method acts that remain the same, refer to the description of the exemplary embodiment in FIG. 2. Method acts in FIG. 3 that are similar to acts in FIG. 2 are labeled with the same reference numbers.

An embodiment of the method depicted in FIG. 3 includes acts 40, 41, 42, 43, 44 of the embodiment of the method according to FIG. 2. In addition, the embodiment of the method depicted in FIG. 3 includes additional acts and subacts. Alternate sequences to that depicted in FIG. 3 may be provided, such as by including one or more of the additional method acts and/or subacts depicted in FIG. 2. Alternate method sequences to FIG. 3 may have additional method acts and/or subacts.

Before the loading of the shim pre-settings, in act 46, a magnetic resonance sequence for recording the magnetic resonance image data is configured (e.g., using the input unit 26). In this act, the examination area from which the magnetic resonance image data is to be recorded is defined. The configuration of the activated coil elements of at least one local coil of the magnetic resonance device 11 for recording the magnetic resonance image data is defined. Depending on the configuration, magnetic resonance image data shim pre-settings (e.g., H, T, A1, A2) are selected. In this example, four different shim pre-settings (e.g., H, T, A1, A2) are available for selection: Head shim pre-settings (H) for recording magnetic resonance image data from a head area of the examination object 15; torso shim pre-settings (T) for recording magnetic resonance image data from a torso area of the examination object 15; first abdomen shim pre-settings (A1) for recording magnetic resonance image data from an abdomen area of the examination object 15 using a first configuration of activated coil elements of a local coil; and second abdomen shim pre-settings (A2) for recording magnetic resonance image data from an abdomen area of the examination object 15 using the second configurations of activated coil elements of a local coil. The shim pre-settings (e.g., H, T, A1, A2) in this example are specific for the examination area and/or for the configurations of the activated coil elements. Additional, different or fewer shim pre-settings may be provided.

For example, as depicted in FIG. 3, a head area of the examination object 15 is to be examined and the head shim pre-settings (H) are selected. The head shim pre-settings (H) are loaded from the database 34 in act 40. For example, the head area of the examination object 15 is to be shimmed using three shim channels of the shim unit 32. Therefore, the head shim pre-settings (H) include three output shim currents (e.g., PS1, PS2, PS3) that are specific for the three shim channels.

In act 41, three shim currents (e.g., S1, S2, S3) are assigned to the three shim channels of the shim unit 32, and are created using the computing unit 24 and the shim control unit 33. The three shim currents (e.g., S1, S2, S3) are included in the shim settings. To create the three shim currents (e.g., S1, S2, S3), the three output shim currents (e.g., PS1, PS2, PS3) are used and are transferred to the shim control unit 33 for this purpose. Each shim current (e.g., S1, S2, S3) is assigned an output shim current (e.g., PS1, PS2, PS3), where the number of shim currents (e.g., S1, S2, S3) are created using the assigned output shim currents (e.g., PS1, PS2, PS3). The three shim currents (e.g., S1, S2, S3) are created in a shim measurement. In this shim measurement, homogeneity of the main magnetic field 18 may be provided (e.g., by measuring a B0 map). The output shim currents (e.g., PS1, PS2, PS3) are included as output values in the shim measurement for creating the shim currents (e.g., S1, S2, S3).

The shim currents (e.g, S1, S2, S3) are optimized for the specific application case (e.g, the recording of the magnetic resonance image data). The three shim currents (e.g, S1, S2, S3) form the shim settings. The shim control unit 33, in act 42, occupies the shim channels of shim unit 32 with the three shim currents (e.g., S1, S2, S3) for recording the magnetic resonance image data. Alternatively, the output shim currents (e.g, PS1, PS2, PS3) and the improved output shim currents (e.g., OPS1, OPS2, OPS3) may not be optimized for a specific recording of magnetic resonance image data, and may represent starting values for the shim measurement in which the optimized shim currents (e.g., S1, S2, S3) used in each case for the recording of the magnetic resonance image data are created.

In act 43, improved output shim currents (e.g., OPS1, OPS2, OPS3) are computed by the computing unit 24. In this example, an averaging of the output shim currents (e.g., PS1, PS2, PS3) and of the shim currents (e.g., S1, S2, S3) created for the specific application case in the shim measurement are included in the calculation of the improved output shim currents (e.g., OPS1, OPS2, OPS3). For example, to calculate the first improved output (e.g., shim current OPS1), the output shim current PS1 is averaged with the first shim current S1.

The improved output shim currents (e.g., OPS1, OPS2, OPS3) are stored in the database 34 in act 44. Acts 40, 41, 42, 43, 44 are executed iteratively, where the improved shim pre-settings (e.g., OPS1, OPS2, OPS3) stored in the database from one iteration are loaded from the database in the following iteration as shim pre-settings (e.g., PS1, PS2, PS3). The magnetic resonance image data may be recorded in a first iteration from the first examination object 15 and in a second iteration from a second examination object 15. Thus, for example, the image data of different patients 15 may be included in the improved output shim currents (e.g., OPS1, OPS2, OPS3).

In act 45, a count value (C) is increased by one after each iteration. This count value (C) may be used in acts 41 and 43 for weighting the computation processes.

In act 41, the output shim currents (e.g, PS1, PS2, PS3), weighted with a weighting factor, may be included in creating the shim currents (e.g, S1, S2, S3), where the weighting factor represents a measure for a number of iterations already undertaken. For example, the weighting factor is directly proportional to the count value (C). In this example, the output shim currents (e.g., PS1, PS2, PS3) may be weighted initially before creating the shim currents (e.g., S1, S2, S3) with the weighting factor (e.g., using equation R=C/S, where C is the count value C and S is a significance value indicating the number of iterations as from which the output shim currents (PS1, PS2, PS3) are sufficiently improved).

The output shim currents (e.g., PS1, PS2, PS3) may be averaged in act 43 using a running averaging with the shim currents (e.g., S1, S2, S3) for calculating the improved output shim currents (e.g., OPS1, OPS2, OPS3). Thus, calculating the improved output shim currents (e.g., OPS1, OPS2, OPS3) may depend on the count value (C). For example, a formula for calculating the first improved output shim current (e.g., OPS1) may be as follows:

$$OPS1=(PS1*C+S1)/(C+1).$$

In one embodiment, all computations for a fixed current value may be added to the output shim currents (e.g., PS1, PS2, PS3) before creating the shim currents (e.g., S1, S2, S3). For example, the fixed current value (e.g., tune-up value) may be determined based on a calibration measurement (e.g., using a standardized phantom). Before calculating the improved output shim currents (e.g., OPS1, OPS2, OPS3), the fixed current value may be deducted again.

The methods depicted in FIGS. 2 and 3 are performed by the magnetic resonance device 11. The magnetic resonance device 11 includes software and/or computer programs stored in a memory unit of the computing unit and/or the control unit of the magnetic resonance device 11. The software and/or computer programs are configured to perform the method when the computer program and/or the software is executed in the computing unit and/or the control unit by a processor unit of the computing unit and/or the control unit.

Although the invention has been illustrated and described in greater detail by the exemplary embodiments, the invention is not restricted by the disclosed examples. Other variations may be derived herefrom by the person skilled in the art, without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, these dependent claims may, alternatively, be made to depend, in the alternative, from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for improving shim pre-settings of a magnetic resonance device, the method comprising:
   loading shim pre-settings from a database;
   creating shim settings by adapting the shim pre-settings for a recording of magnetic resonance image data of an examination object using the magnetic resonance device;
   activating, using the created shim settings, a shim unit of the magnetic resonance device for the recording of the magnetic resonance image data;
   replacing the shim pre-settings with the created shim settings to provide improved shim pre-settings;
   storing the improved shim pre-settings in the database as replacements for the shim pre-settings; and
   generating new shim settings by adapting the improved shim pre-settings for a new recording of new magnetic resonance image data of the examination object or a different examination object using the magnetic resonance device, wherein the generating of the new shim settings converges faster using the improved shim pre-settings in comparison to the shim pre-settings.

2. The method of claim 1, wherein the loading, the creating, the activating, the replacing, and the storing are repeated in at least two iterations, each iteration performed after recordation of magnetic resonance data, and wherein the improved shim pre-settings stored in one of the at least two iterations in the database are loaded from the database as shim pre-settings in the following iteration of the at least two iterations.

3. The method of claim 2, wherein the magnetic resonance image data is recorded in a first iteration from a first examination object and in a second iteration from a second examination object.

4. The method of claim 3, wherein the shim unit of the magnetic resonance device includes a plurality of shim channels, wherein the shim settings include a plurality of shim currents, and wherein at least one shim current of the plurality of shim currents is assigned to each shim channel of the plurality of shim currents.

5. The method of claim 4, wherein the shim pre-settings comprise a plurality of output shim currents, wherein each shim current of the plurality of shim currents is assigned at least one output shim current of the plurality of output shim currents, wherein the plurality of shim currents is created using the assigned output shim currents.

6. The method of claim 5, wherein the plurality of output shim currents, weighted with a weighting factor, are used in the creation of the shim currents, and wherein the weighting factor represents a measure for the number of iterations already performed.

7. The method of claim 6, wherein the improving of the shim pre-settings comprises calculating improved output shim currents, the calculating of the improved output shim currents comprising averaging the output shim currents and an average of the generated shim currents.

8. The method of claim 1, wherein the magnetic resonance image data is recorded from an examination area of the examination object, and wherein the shim pre-settings are specific for the examination area.

9. The method of claim 1, wherein the magnetic resonance image data is recorded using a configuration of activated coil elements of at least one local coil, and wherein the shim pre-settings are specific for the configuration of the activated coil elements.

10. A magnetic resonance device comprising:
a shim unit;
a computing unit configured to:
load shim pre-settings from a database;
create shim settings by adapting the shim pre-settings for a recording of magnetic resonance image data of an examination object using the magnetic resonance device; and
a shim control unit configured to activate, using the created shim settings, the shim unit to record the magnetic resonance image data,
wherein the computing unit is further configured to:
replacing the shim pre-settings with the created shim settings to provide improved shim pre-settings;
store the improved shim pre-settings in the database as replacements for the shim pre-settings; and
generate new shim settings by adapting the improved shim pre-settings for a new recording of new magnetic resonance image data of the examination object or a different examination object using the magnetic resonance device, wherein the generation of the new shim settings converges faster using the improved shim pre-settings in comparison to the shim pre-settings.

11. The magnetic resonance device of claim 10, wherein the computing unit and the shim control unit, together, are configured to perform at least two iterations, each iteration performed after recordation of magnetic resonance data, and wherein the improved shim pre-settings stored in one iteration of the at least two iterations in the database are loaded from the database as shim pre-settings in an iteration of the at least two iterations following the one iteration.

12. The magnetic resonance device of claim 11, wherein the magnetic resonance image data is recorded in a first iteration from a first examination object, and magnetic resonance image data is recorded in a second iteration from a second examination object.

13. The magnetic resonance device of claim 12, wherein the shim unit includes a plurality of shim channels, wherein the shim settings include a plurality of shim currents, and wherein at least one shim current of the plurality of shim currents is assigned to each shim channel of the plurality of shim currents.

14. The magnetic resonance device of claim 13, wherein the shim pre-settings comprise a plurality of output shim currents, wherein each shim current of the plurality of shim currents is assigned at least one output shim current of the plurality of output shim currents, and wherein the plurality of shim currents is created using the assigned output shim currents.

15. The magnetic resonance device of claim 14, wherein the plurality of output shim currents, weighted with a weighting factor, are used in creating the plurality of shim currents, and wherein the weighting factor represents a measure for the number of iterations performed.

16. In a non-transitory computer-readable storage medium storing program code including instructions executable by a programmable computing unit of a magnetic resonance device to improve shim pre-settings of a magnetic resonance device, the instructions comprising:

loading shim pre-settings from a database;
creating shim settings by adapting the shim pre-settings for a recording of magnetic resonance image data of an examination object using the magnetic resonance device;
activating, using the created shim settings, a shim unit of the magnetic resonance device for the recording of the magnetic resonance image data;
replacing the shim pre-settings with the created shim settings to provide improved shim pre-settings;
storing the improved shim pre-settings in the database as replacements for the shim pre-settings; and
generating new shim settings by adapting the improved shim pre-settings for a new recording of new magnetic resonance image data of the examination object or a different examination object using the magnetic resonance device, wherein the generating of the new shim settings converges faster using the improved shim pre-settings in comparison to the shim pre-settings.

17. The non-transitory computer-readable storage medium of claim 16, wherein the program code is executable to perform at least two iterations, each iteration performed after recordation of magnetic resonance data, and wherein the improved shim pre-settings stored in one iteration of the at least two iterations in the database are loaded from the database as shim pre-settings in the following iteration of the at least two iterations.

18. The non-transitory computer-readable storage medium of claim 17, wherein the magnetic resonance image data is recorded in a first iteration from a first examination object, and magnetic resonance image data is recorded in a second iteration from a second examination object.

19. The non-transitory computer-readable storage medium of claim 18, wherein the shim unit of the magnetic resonance device includes a plurality of shim channels,
 wherein the shim settings include a plurality of shim currents, and
 wherein at least one shim current of the plurality of shim currents is assigned to each shim channel of the plurality of shim currents.

20. The non-transitory computer-readable storage medium of claim 19, wherein the shim pre-settings comprise a plurality of output shim currents,
 wherein each shim current of the plurality of shim currents is assigned at least one output shim current of the plurality of output shim currents, and
 wherein the plurality of shim currents is created using the assigned output shim currents.

\* \* \* \* \*